United States Patent
Burns et al.

(10) Patent No.: US 9,054,144 B2
(45) Date of Patent: *Jun. 9, 2015

(54) POROUS BARRIER FOR EVENLY DISTRIBUTED PURGE GAS IN A MICROENVIRONMENT

(75) Inventors: John Burns, Colorado Springs, CO (US); Mark V. Smith, Colorado Springs, CO (US); Matthew A. Fuller, Colorado Springs, CO (US)

(73) Assignee: Entegris, Inc., Billerica, MA (US)

( * ) Notice: Subject to any disclaimer, the term of this patent is extended or adjusted under 35 U.S.C. 154(b) by 139 days.

This patent is subject to a terminal disclaimer.

(21) Appl. No.: 13/515,129

(22) PCT Filed: Dec. 10, 2010

(86) PCT No.: PCT/US2010/059956
§ 371 (c)(1),
(2), (4) Date: Aug. 15, 2012

(87) PCT Pub. No.: WO2011/072260
PCT Pub. Date: Jun. 16, 2011

(65) Prior Publication Data
US 2012/0297981 A1    Nov. 29, 2012

Related U.S. Application Data

(60) Provisional application No. 61/285,218, filed on Dec. 10, 2009.

(51) Int. Cl.
*B65D 85/38*    (2006.01)
*B65D 85/86*    (2006.01)
*H01L 21/673*   (2006.01)
*H01L 21/68*    (2006.01)

(52) U.S. Cl.
CPC ................. *H01L 21/67393* (2013.01)

(58) Field of Classification Search
USPC .......... 55/385.6; 118/715, 724, 500; 206/710, 206/711, 454; 414/217, 291, 935; 141/98, 141/85, 383
See application file for complete search history.

(56) References Cited

U.S. PATENT DOCUMENTS

| 4,616,683 A | * | 10/1986 | Tullis et al. ................ 414/217.1 |
| 5,575,081 A | | 11/1996 | Ludwig |
| 6,221,163 B1 | * | 4/2001 | Roberson et al. ............. 118/715 |

(Continued)

FOREIGN PATENT DOCUMENTS

| JP | 11-307623 | 11/1999 |
| JP | 2003-168728 | 6/2003 |
| JP | 2003-168728 (A) | 6/2003 |

(Continued)

*Primary Examiner* — Duane Smith
*Assistant Examiner* — Minh-Chau Pham
(74) *Attorney, Agent, or Firm* — Christensen Fonder P.A.

(57) ABSTRACT

An improved system and method for purging a microenvironment to desired levels of relative humidity, oxygen, or particulates through the implementation of a purge gas delivery apparatus and method that provides even distribution of the purging gas within the microenvironment. A substrate container has a tower therein with a fluid flow passageway extending the length of the tower. Apertures with porous media between the aperture and fluid flow passageway regulate the volume and pressure of air discharging at each aperture. Alternatively, the tower may be formed of a porous tubular polymeric material. A sleeve may direct the discharge purge gas in the interior.

7 Claims, 5 Drawing Sheets

(56) References Cited

U.S. PATENT DOCUMENTS

| | | |
|---|---|---|
| 6,368,411 B2 | 4/2002 | Roberson, Jr. et al. |
| 6,758,876 B2 | 7/2004 | Suzuki et al. |
| 6,899,145 B2 | 5/2005 | Aggarwal |
| 2010/0022093 A1 | 1/2010 | Yamaguchi |
| 2011/0114534 A1* | 5/2011 | Watson et al. ............ 206/710 |

FOREIGN PATENT DOCUMENTS

| | | |
|---|---|---|
| JP | 2004-146676 | 5/2004 |
| JP | 2008-066635 | 3/2008 |
| JP | 2008-251631 (A) | 10/2008 |
| TW | 448485 (B) | 8/2001 |
| WO | WO 2009/114798 A2 | 9/2009 |

* cited by examiner

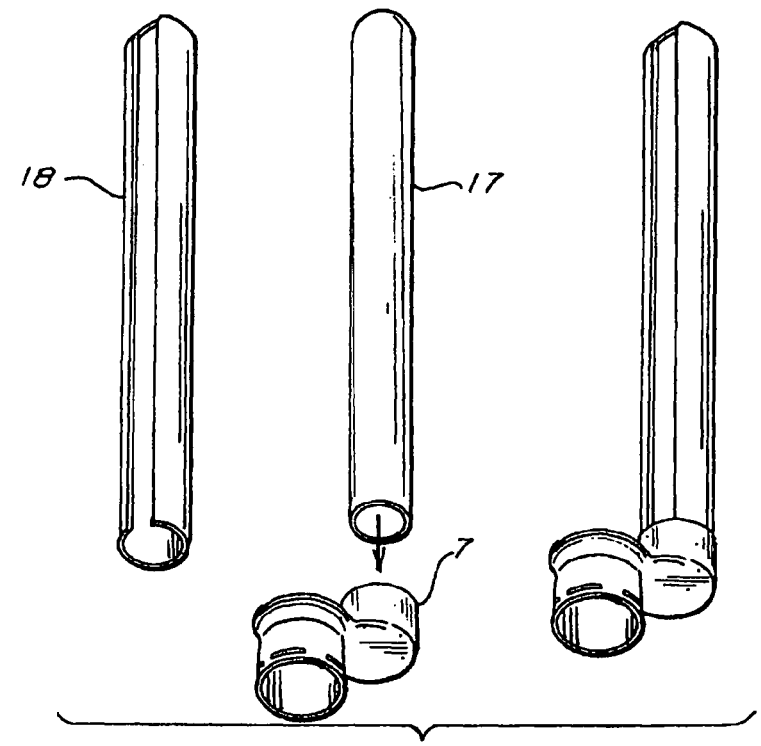
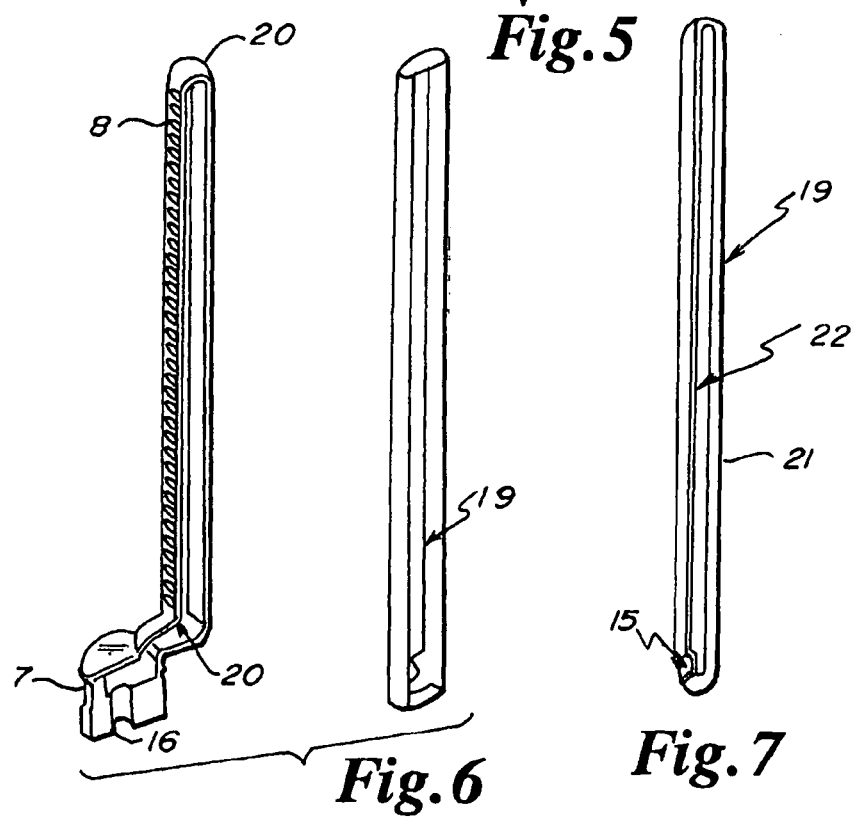
Fig. 5
Fig. 6
Fig. 7

US 9,054,144 B2

POROUS BARRIER FOR EVENLY DISTRIBUTED PURGE GAS IN A MICROENVIRONMENT

RELATED APPLICATIONS

Priority Claim

The present application is a National Phase entry of PCT Application No. PCT/US2010/059956, filed Dec. 10, 2010, which claims priority from U.S. Provisional Application No. 61/285218, filed Dec. 10, 2009, the disclosures of which are hereby incorporated by reference herein in their entirety.

TECHNICAL FIELD OF THE INVENTION

The present invention relates to transportable substrate containers suitable for use in storing or transporting objects such as semiconductor wafers in an extremely clean environment and more particularly to systems and methods for purging the environment within said container to desired levels of relative humidity, oxygen, and airborne particulates.

BACKGROUND OF THE INVENTION

During transport or storage of substrates, if traces of dust or gaseous impurities present in the surrounding air adhere to the semiconductor wafers or other objects, the subsequent product yield from the affected wafer is lowered. This tendency becomes increasingly noticeable as the degree of integration increases. Accordingly, there is an increased demand for the environment within these transport containers to achieve a high level of cleanliness regarding not only dust but also gaseous impurities.

Currently to produce a clean space for accommodating substrates when transported or stored, microenvironments are purged using an inert gas which is injected into the interior of the container through an inlet port causing the air within the container to exit through an outlet port. These purge gas inlet and outlet ports are generally located on the bottom surface of the container shell and extend from the interior through the shell bottom surface where they interface with the purge gas delivery system. This method uses a check valve and circular PTFE particulate filter located in the purge inlet port to control and filter the incoming purge gas. The inert purge gas then replaces the air and contaminants within the container and the contaminated air is forced out of the container through the purge outlet port or the door opening if the door is removed.

Other methods of delivering purge gas into the container have been designed to provide the improved environment within the container, these prior art attempts have significant drawbacks which precipitate the need for the present invention. For example, U.S. Pat. No. 6,221,163 to Roberson et al. discloses a system and method for molecular contamination control permitting purging a container to desired levels of relative humidity, oxygen, or particulates. The container includes an inlet port and an outlet port, each including a check valve and filter assembly for supplying a clean, dry gaseous working fluid to maintain low levels of moisture, oxygen, or particulates. The inlet port is connected with a gaseous working fluid source and the outlet port is connected to an evacuation system. The integral directional flow check valves operate at very low pressure differentials (such as less than 10 millibar). In one embodiment, flow of purge gas inside the container can be directed towards the substrates with one or more nozzle towers to encourage laminar flow inside the pod. One or more outlet towers, having a similar function to that of the inlet tower may also be provided to encourage laminar flow inside the container. This method has a particulate filter located in the check valve/filter assembly located in the bottom of the tower. The disadvantage of this method is that as the purge gas flows through the orifices of the tower, the distribution of gas decreases from the tower top orifice to the tower bottom orifice. This results in an extended time to evacuate the water and oxygen from the microenvironment.

One goal of purging is to decrease humidity and oxygen levels in the internal volume of the microenvironment. A challenge of purging is to evenly distribute the purge gas fast and effectively over the substrates within the container. Current purging methods, using inlet and outlet ports at the bottom of the container do not meet either requirement of purging fast or effectively because the path of least resistance for the purge gas flow is directly from the inlet to the outlet. Little of the gas flows between the wafers, and the volume between the wafers is a dead zone that is not immediately affected by the purge gas. This results in non-uniform humidity and oxygen levels within the microenvironment. Utilizing the purge tower improves the speed and effectiveness of the purge, but the orifices in the tower still do not evenly distribute the purge gas between the wafers even with the implementation of graduated orifices. In effect, as the purge gas flows through the orifices of the tower, the distribution of gas decreases from the top orifice to the bottom orifice. This results in ineffective evacuation of water and oxygen from the microenvironment.

Another goal of purging is to remove airborne contaminants from the environment within the container. These contaminants are primarily trapped in the filtering mechanism in the purge ports and are effectively removed when the container is purged. However, the containers are reusable and prior to reuse must be cleaned. As a part of the cleaning process, a human operator must remove the purge tower and the purge port/filter mechanisms to keep water from accumulating in these devices. Contaminants are introduced into the microenvironment from the human operator during the process of removing/reinstalling the purge towers and purge ports/filters.

A need therefore exists for an improved purging method which solves the problems of evacuating the wafer container in a fast and efficient manner. In particular, a need exists for a purging method and apparatus that can allow the purge gas to accumulate in the tower so that as the gas accumulates and the pressure inside of the tower increases therefore the gas flows through the tower into the microenvironment and is evenly distributed between the wafers. Another need is to minimize or eliminate human operators from reaching inside the container. Currently, operators must reach inside the container to remove and reinstall the purge towers and purge ports/filters when the container is cleaned and returned to service.

SUMMARY OF THE INVENTION

In view of the above mentioned problems, the present invention provides for an improved system and method for purging a microenvironment to desired levels of relative humidity, oxygen, or particulates through the implementation of a purge gas delivery apparatus and method that provides even distribution of the purging gas within the microenvironment.

An additional advantage of the present invention is that the purge tower porous barrier may be composed of a hydrophobic material that prevents water from entering the purge tower during the cleaning process which consequently eliminates the need to remove the purge gas delivery apparatus during the cleaning process which avoids introducing particles into the microenvironment from the removal and reinstallation process of the purge gas delivery apparatus after cleaning.

Further advantages of the invention are that the porous barrier may be formed into shapes that match the non-flat geometry of the purge tower and by resisting the flow of gas, the porous barrier allows for the purge gas to accumulate in the tower. As the gas accumulates, the pressure inside the tower increases and when the pressure is sufficient to overcome the barrier material, the gas flows through the barrier material into the wafer container and is evenly distributed among the installed wafers in the container.

A further advantage of the invention is that the purge tower significantly reduces the relative humidity level within the microenvironment in instances where the wafer access door has been removed.

A further advantage of the invention is that the purge tower porous barrier improved purging efficiency from top to bottom of the microenvironment.

In one preferred embodiment, the microenvironment includes an inlet port and an outlet port, each including a check valve assembly and a purge tower connected to the inlet port and the outlet port for a clean, dry gaseous working fluid that is used to provide controlled low levels of moisture, oxygen, and particulate content around the materials contained in the microenvironment. The microenvironment container inlet port is connected with a gaseous working fluid source, and the outlet port is connected with an evacuation system. In operation, according to one embodiment, the tower includes a sealing grommet in the tower base portion that maintains a seal against the container shell to prevent undesired chemicals or particulates from entering into the interior of the wafer container. Thus, any flow between the interior and exterior of the wafer container is limited to passing through the passageway defined by the grommet. Types of fluid flows include the introduction of purging gases such as nitrogen into the interior of the wafer container. The fluid flow can be further limited by the porous barrier element. The porous barrier provides filtering to the purge gas to remove particulates as well as oxygen and humidity from the purge gas prior to the gas being introduced into the interior of the wafer container. The integral directional flow check valves operate at very low pressure differentials. In this embodiment, a porous membrane barrier is placed in the inlet tower directly behind the tower orifices. The membrane barrier improves the performance of the tower in two ways. For the first improvement, the membrane barrier allows for the purge gas to evenly pressurize within the tower. The pressurized gas then evenly flows through the membrane and the tower orifices and into the container interior. The orifices in the tower can be of any shape including a continuous vertical opening from top to bottom of the tower such that the tower has a "C" shape as viewed from the top down. This results in evenly distributed purge gas between the substrates in the microenvironment and the tower resulting in an improved reduction in relative humidity and oxygen from the microenvironment. For the second improvement, the barrier can be manufactured from a material with hydrophobic characteristics that act as a water barrier during the cleaning of the microenvironment. This hydrophobic water barrier keeps water out of the purge tower and consequently the purge port during the cleaning process. The porous membrane barrier also functions as a particle filter which removes particles from the gas flow which eliminates the need for a particle filter in the purge port at the base of the tower.

In an additional embodiment, the membrane barrier is manufactured out of a porous polymer that is formable into geometry that matches the geometry of the tower. A benefit of the formed barrier is that it can also be used to seal the mating surfaces of the rear and slotted front portions that make up the purge tower. Additionally, the barrier can be formed into a flat woven shape and used to cover the orifices in the front portion of the tower.

An additional embodiment, the purge tower itself can be fabricated from the same porous polymer material as is used for the membrane barrier avoiding the need for orifices, radial slots, or separate tower portions to form the tower. This tower may be manufactured as a capped porous tube that attaches directly to the inlet/outlet ports on the bottom surface of the container. This tower can be made as a "C" shaped sleeve that can be situated such that flow is directed towards the substrates or towards the container wall, or any other direction desired simply by how the sleeve is positioned in the microenvironment.

An additional embodiment is that the porous membrane filter can be made as a bladder that is installed within the tower. In this embodiment, the porous material not only covers the purge tower nozzles but also the reveal between the front and back portions of the purge tower. This allows for any leakage through the reveal to be filtered as well as any water to be blocked from coming into the tower through the reveal. The purge gas is injected into the filter bladder at the base of the tower and subsequently is dispersed through the bladder walls, through the tower slots and into the container interior. The bladder can be manufactured either as a complete tube that is installed between the front and back portions of the tower, or as a complete tube that is installed between the front and back portions of the tower.

BRIEF DESCRIPTION OF THE FIGURES

FIG. 5 is an exploded view of the purge tower made of porous polymer material which is then press-fit into the molded base portion.

FIG. 6 is an exploded view of the tower and porous membrane bladder.

FIG. 7 is a cross section view of the complete tube shape bladder showing the gas inlets and the different wall section thickness which enables the purge gas flow toward the disperse slots in the front portion of the tower.

DETAILED DESCRIPTION OF THE INVENTION

Figure 1A:
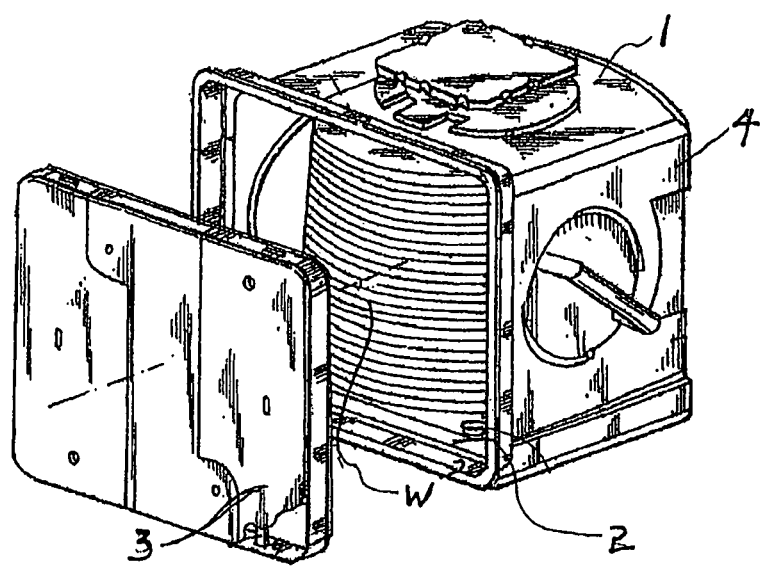
FIG. 1A is a front opening wafer container.

FIG. 1A illustrates a configuration of a substrate container configured as a wafer container assembly 1 known as a FOUP or FOSB comprising an open front 2, a front door 3, and an enclosure portion 4. Wafers W are inserted and removed horizontally through the open front. Slots formed in the interior sides hold the substrates, in this case semiconductor wafers. Front door 3 with seal sealingly engages with enclosure portions 4 to form an interior space that is isolated from the ambient atmosphere. Receiving structure 5 for the purge towers 6 may be in the bottom wall of the enclosure portion.

Figure 1B:
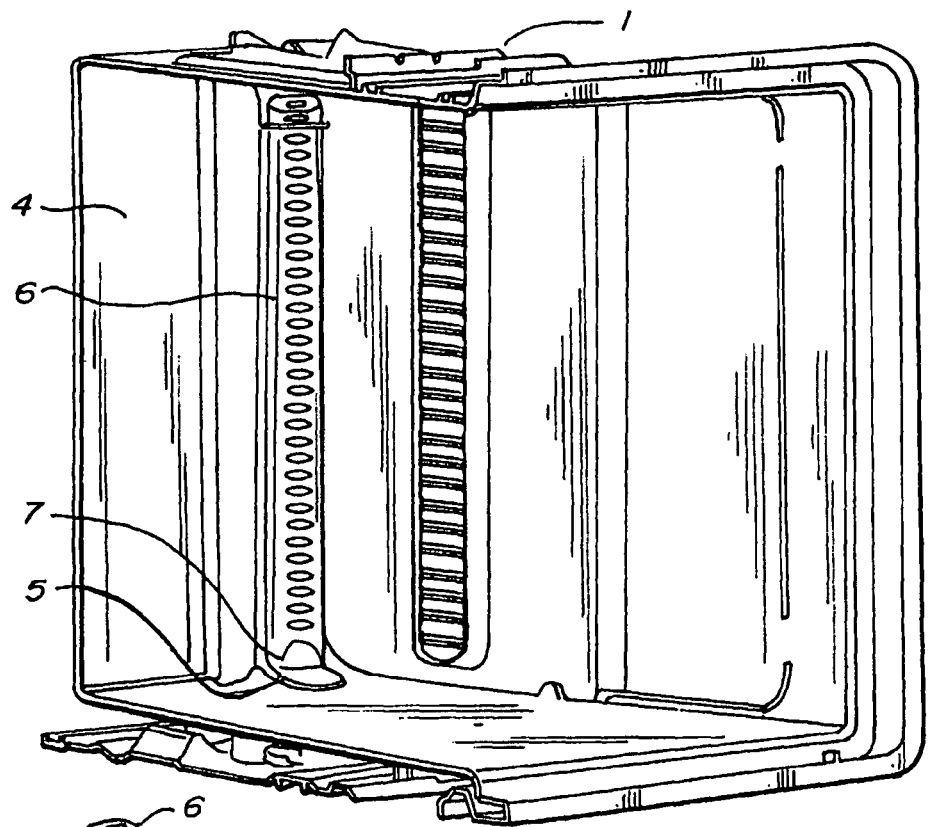
FIG. 1B shows a front opening wafer container with one purge tower installed.
Figure 2:
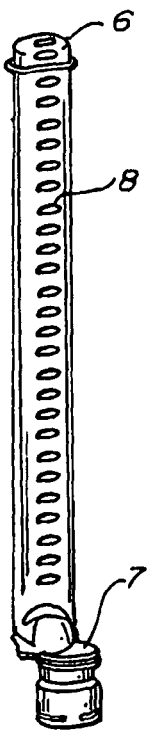
FIG. 2 is a front view of the tower showing the gas dispersal slots

Referring to FIG. 1B, a purge tower 6 is shown that is part of the preferred embodiment enabling gaseous working fluid or purge gas inside a substrate container to be directed toward and away from substrates housed in the container using one or more uniquely configured towers 6 connected by a base portion 7 to the inlet port or the outlet port. Orifices are provided in each tower, preferable in the form of a series of spaced apart nozzles 8. The gaseous purge fluid will sweep the container and its contents picking up residual moisture, oxygen and AMC's and encouraging movement of particulates toward the outlet port or door opening. U.S. Pat. No. 6,221,163, owned by the owner of the instant invention, and International Publication No. WO2009/114798 A2, also owned by the owner of the instant application disclose certain structural configurations, assembly details, materials which may be applicable to embodiments of the inventions disclosed herein, said patent and publication are incorporated by reference herein In an alternate embodiment, shown in FIG. 5 the tower configuration can be in the form of a tower 17 made from the porous polymer material which is friction fitted onto the base unit 7. One or more vent towers are also preferable connected to the outlet port or ports, having a structure and function similar to that of the inlet towers, to direct flow to the outlet valve for exhausting to the instrument suite.

Figure 3:
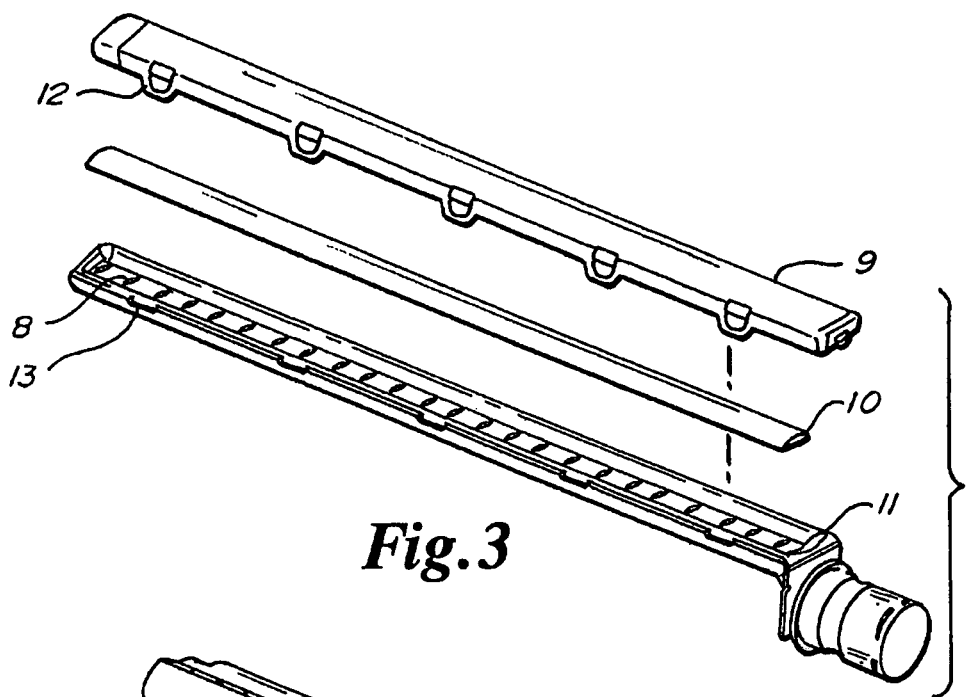
FIG. 3. is an exploded view of the back portion of the tower, the porous membrane barrier and the slotted front portion of the tower
Figure 4:
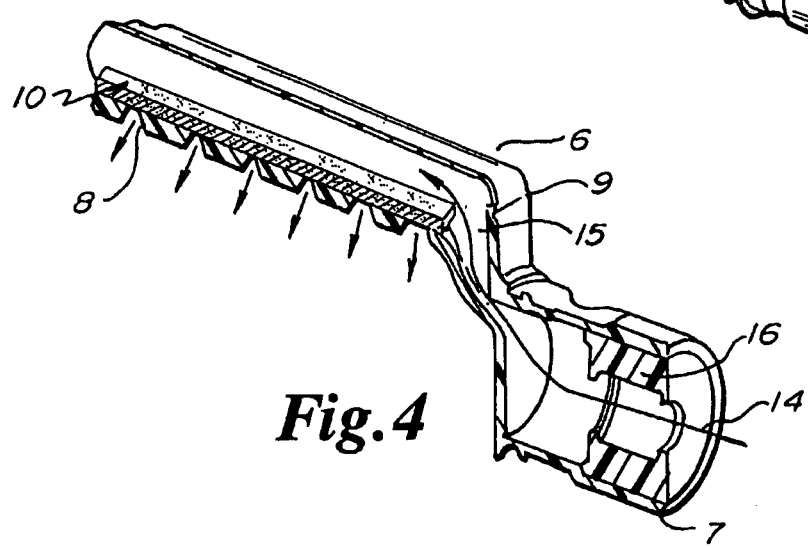
FIG. 4 shows the purge gas flow into the tower and subsequently out through the barrier membrane and the tower slots into the container interior.

FIGS. 3 and 4 show the interior of the tower with the porous material filter installed. FIG. 3 is an exploded view of the entire tower. This view shows the tower rear portion 9 which is a molded separate part that is connected to the tower front portion 11 with a series of tabs 12 located on the tower rear portion 9 that fit into recesses 13 on the tower front portion 11. FIG. 3 is a cut away view of the interior of the tower 6 near the base portion 7 showing the tower grommet 16, the purge gas inlet 14, and the purge gas flow path through the grommet and into the tower flow conduit or fluid flow passageway 15 and out of the nozzle orifices 8. Purge gas enters the tower 6 through the purge gas inlet 14, passes through the gas conduit and the presence of the barrier filter configured as a strip of porous material 10 allows the gas pressure to build inside the tower until the pressure is sufficient to overcome the filter membrane and then is dispersed through the nozzle orifices 8 into the interior of the container at a uniform pressure and distribution from top to bottom. In other words, a pressure drop across the filter material allows a uniform pressure along the entire length of the tower that is greater that the pressure outside the tower in the interior of the container. The higher pressure along the length of the tower provides uniform air flow out each orifice or each outlet region or equal air discharge along the length of an outlet slot. The pressurization allows the purge gas to clean the interior volume through laminar flow across all of the substrates installed within the container. Ideally the diameter of the tower is 0.75 inches to 2.0 inches and the tower wall thickness is 1/16 inch to 3/8 inches. Ideally the length of the tower is 70% to 100% of the interior height of the container portion where the tower is located. And ideally the length of the tower portion is at least the distance between the lowermost substrate slot and the uppermost substrate slot.

The system and method of the invention are planned for use while the container is waiting for the next production station or step in the fabrication process. These periods have been estimated to be about six minutes to more than one hour long. Ideally, the container is completely purged to desired levels of relative humidity, oxygen, or particulates in a period of about 6 minutes or less. Relative humidity levels of about 0.1% or less have been achieved in about 5 minutes. Flow of the gaseous working fluid or purge gas is typically provided in the container at up to 20 SCFH, and at a pressure of from about zero to about 5 psi. Pressurized nitrogen gas and other inert gases are typically available at pressures from about 65 to about 125 psi, and the pressure of the working gas within the system is typically controlled using a point-of-use regulator, limiting feed pressure to the inlet of the container to a maximum of about 10 psi. Working pressures within the container are typically about 1 psi. The gaseous working fluid or purge gas is filtered to remove particulates as small as 0.10-2.0 microns at an efficiency of about 99.999%

FIG. 5 shows the alternate embodiment of the tower configured as a tubular structure formed entirely of, or substantially entirely of, porous material so that the tower portions are no longer needed. Tower portion tubular structure 17 is molded from the porous barrier material and formed into the shape of the tower portion without the nozzle slots in the front portion. The molded purge tower is then friction fit attached to the base portion 7. The purge gas behaves the same as in the preferred embodiment in that the gas in held within the tower until the pressure increases to a level sufficient to permeate the barrier material and proceed to the interior of the container. An alternate embodiment of the molded barrier is one in which the tower in made from the barrier material, however sleeve 18 is added that is "C" shaped in a horizontal cross section. This allows the purge gas to pass through the tower material and onto the substrates through the open slot running the entire length of the sleeve from top to bottom. This tower configuration allows improved directionality of the purge gas through the relatively large single purge slot that is adjustable by rotating the sleeve on the tower. The sleeve may provide a cap or end plug on the top of a tubular porous form that is otherwise open at the top.

FIG. 6 shows the bladder 19 which is molded out of the porous barrier polymer material so that it fits into the tower 6 and provides the purge gas filtering and pressurization by not only covering the orifice nozzles 8, but also sealing the reveal 20 where the two separately molded tower halves 9 and 11 are mated. The bladder shown in the illustration is molded without a back side to facilitate the molding process. Therefore the bladder 19 must be inserted into the tower with the opening away from the orifices 8 in order to work properly. Each of the bladders has an interior fluid flow passageway 23 that extends the length of the bladder and the length or substantially the length of the tower. The bladders may be formed of a flexible woven polymeric porous material.

FIG. 7 shows an alternative construction for bladder 19. This view, which is a cut away view of the bladder shows the different thicknesses of the walls of the bladder. The front bladder wall 22 is thinner that the rear bladder wall 21. This different thickness facilitates the purge gas delivery since the gas will permeate faster and easier through the thinner wall 22 which is facing the tower orifices than through the thick rear wall 21. This difference in wall thickness requires that the bladder is correctly installed. The porous material is preferably porous polymers such as polyethylene, polypropylene, PTFE (polytetrafluoroethylene), or PFA (perfluoroalkoxy). The porosity in the porous material may be, for example, be in the form of a foamed material, a fibrous material or a sintered material. The fibrous material can be woven or randomly packed or intertwined. The particular shapes herein can be formed by thermal molding or, in some cases, by machining rigid blocks or preforms of the porous material. Suitable porous polymers are available from GenPore, 1136 Morgantown Rd, Reading Pa.

Appropriate porous materials used in the purge tower to improve the flow of the purge gas of the tower into the container by by making it uniform along the length of the tower by providing sufficient pressurization of the gas to build pressure within the tower prior to permeating through the barrier membrane filter material which provides for a uniform pressure and dispersion within the container and across all of the substrates. Simultaneously this material has hydrophobic characteristics such that it prohibits or minimizes water from entering the purge tower during the wash cycles of the recycling procedure. Keeping water out of the purge tower and the purge inlet and purge outlet minimizes the time required for the cleaning process and keeps the container cleaner.

Figure 8:
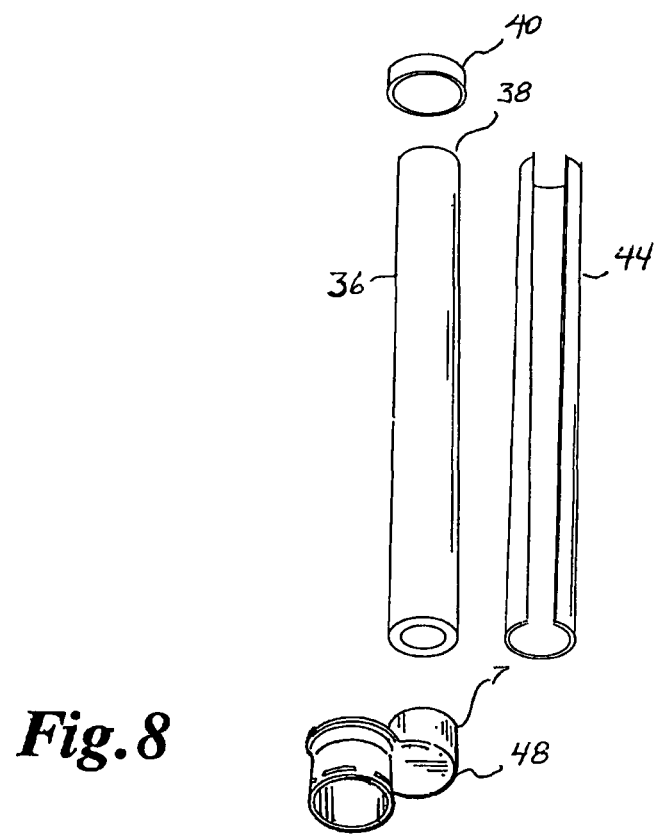
FIG. 8 shows the respective flow data for porous polyethylene and porous polypropylene in the presence of air pressure and water pressure.

Referring to FIG. 8, in an embodiment, the purge tower may be formed of a tubing portion 36 formed of porous material closable at the top end 38, with a cap 40, suitably formed of nonporous polymer that can be sealing fit over the top of the tubing. To direct the discharge on one side of the tower, non porous polymer blocking sleeve 44 configured as a tubing segment with a slit extending axially and formed of a non porous polymer, my be fitted around the porous tubing portion. The bottom may be secured to a nonporous polymer fitting 48 and connected at the bottom end to a purge port. The purge port is connectable to a purge gas source exterior of the container by conventional means. The purge tower may be pressurized such that flow velocities and flow volumes near the top of the tower are equal or substantially equal to such flow velocities and volumes near the bottom of the tower. Ideally the diameter of the tubing portion is 0.75 inches to 2.0 inches and the tubing portion wall thickness is 1/8 inch to 3/8 inches. Ideally the wall thickness of the tubing portion is 10% to 25% of the diameter. Ideally the length of the tubing portion is 70% to 100% of the interior height of the container portion where the tubing portion is located. And ideally the length of the tubing portion is at least the distance between the lowermost substrate slot and the uppermost substrate slot.

Figure 9:
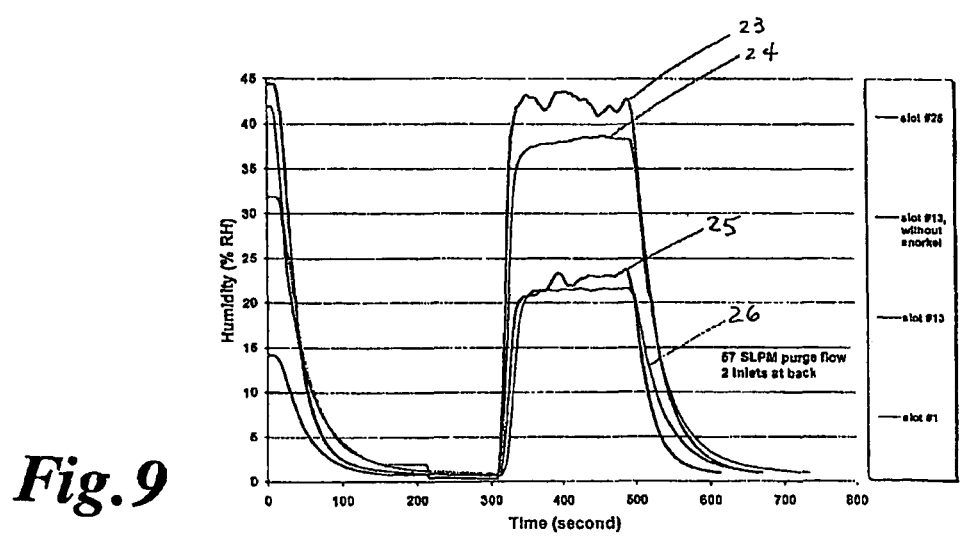
FIG. 9 shows the reduction in relative humidity measured at wafer slot #1, wafer slot #13 and wafer slot #25 with the door removed before and after purge with the present invention.

FIG. 9 shows the levels of relative humidity within the microenvironment before and after purging with the present invention installed and with the door removed. Measurements of relative humidity made before purging at wafer slot #13 indicates a relative humidity level 23 of between 40% and 45%. Another measurement made prior to purging at wafer slot #1 indicates a relative humidity level 24 of between 35% and 40%. After purging, relative humidity measurements at wafer slot #25 indicate a relative humidity level 26 of between 20% and 25%. Another measurement made after purging at wafer slot #13 also indicates a relative humidity level 25 of between 20% and 25%.

While the present invention has been described herein in conjunction with a preferred embodiment, a person with ordinary skill in the art, .after reading the foregoing, can effect changes, substitutions of equivalents and other types of alterations to those set forth herein. Each embodiment described above can also have included or incorporated therewith such variations as disclosed in regard to any or all of the other embodiments. Thus, it is intended that protection granted by Letters Patent hereon be limited in breadth and scope only by definitions contained in the appended claims and any equivalents thereof.

What is claimed is:

1. A system for transporting substrates comprising:
    a substrate container having a container portion with an opening for loading/unloading substrates, a door adapted to sealably cover the opening;
    a substrate carrying section disposed in the sunstrate container;
    an apparatus comprising an inlet tower adapted to be mounted to the container portion for admitting a gaseous working fluid to interior of the container portion for purging the container portion with the gaseous working fluid;
    the inlet tower having a length and comprising a porous tubular portion seated in a non porous polymer fitting with an offset portion, the entirety of the gaseous working fluid passing through an upwardly facing opening of the fitting, and an interior flow passageway extending the length of the tower; and
    a check valve positioned in the fitting.

2. The system of claim 1, wherein said inlet tower comprises a porous polymeric material that blocks water from the interior of the tower.

3. An apparatus for transporting substrates comprising:
    a substrate transport container having a container body with a wafer loading/unloading opening and a door adapted to sealably cover the opening; and
    an apparatus for admitting a gaseous working fluid to an interior of the container body comprising an inlet tower and a bladder portion made from porous filter material, the bladder portion extending a length of the inlet tower, wherein said bladder has one side that is thinner than an opposite side.

4. An apparatus for transporting substrates comprising:
    a substrate transport container having a container body with a wafer loading/unloading opening and a door adapted to sealably cover the opening; and
    an apparatus for admitting a gaseous working fluid to an interior of the container comprising an inlet tower and a bladder portion made from the porous filter material, the bladder portion extending a length of the inlet tower, wherein said bladder has a length and is open on one side of said elongate bladder, said opening extending at least substantially the length of the elongate bladder.

5. A method of providing equalized purging flow of a gasous fluid along the length of a purge tower in a substrate container, the method comprising providing a purge tower of a porous tubing, the tubing closed at a top end, connecting the bottom end to a purge port including a fitting with an offset portion, connecting the purge port to a purge gas source exterior of the container, passing the entirety of the gaseous fluid through an upwardly facing opening of the fitting into the porous tubing, and providing a pressurization of the purge tower such that flow velocities and volumes near the top of the tower are equal or substantially equal to such flow velocities and volumes near the bottom of the tower.

6. The method of claim 5 wherein the method further provides adjusting the direction of the purge flow utilizing an elongate sleeve with a lengthwise slot, the sleeve conforming to and fitted to the tubing portion.

7. A substrate container comprising:
    a substrate container having a container portion with an opening for loading/unloading substrates, a door adapted to sealably cover the opening; the substrate container having
    a substrate carrying region in the substrate container and further comprising an inlet tower mounted to the container portion in an interior of the container portion for admitting a gaseous working fluid to the interior of the container portion for purging the container portion with the gaseous working fluid;

the inlet tower having a length and comprising a tubing portion having a pair of ends and formed of porous material, the tubing portion secured to a nonporous polymer fitting entirely at a bottom of the container portion, the fitting having an upwardly facing opening whereby the entirety of the gaseous fluid passes through the upwardly facing opening of the fitting into the tubing portion, the fitting having an offset portion and providing a purge inlet port, the tubular portion having an axial fluid flow passageway connecting to the purge inlet port at a bottom of the container portion for allowing purge gas to flow up the tubing portion and to exit the tubing portion along the length of the tubing portion above the fitting.

* * * * *